US008830099B1

(12) United States Patent
Straayer et al.

(10) Patent No.: US 8,830,099 B1
(45) Date of Patent: Sep. 9, 2014

(54) MDAC WITH DIFFERENTIAL CURRENT CANCELLATION

(71) Applicant: Maxim Integrated Products, Inc., San Jose, CA (US)

(72) Inventors: Matthew Straayer, Acton, MA (US); Hae-Sung Lee, Lexington, MA (US); Kush Gulati, Weston, MA (US)

(73) Assignee: Maxim Integrated Products, Inc., San Jose, CA (US)

( * ) Notice: Subject to any disclaimer, the term of this patent is extended or adjusted under 35 U.S.C. 154(b) by 0 days.

(21) Appl. No.: 13/748,177

(22) Filed: Jan. 23, 2013

(51) Int. Cl.
*H03M 1/66* (2006.01)

(52) U.S. Cl.
USPC .......................................... 341/144; 341/161

(58) Field of Classification Search
USPC ................... 341/155, 144, 161; 330/279, 296
See application file for complete search history.

(56) References Cited

U.S. PATENT DOCUMENTS

| | | | | |
|---|---|---|---|---|
| 6,958,723 | B1 * | 10/2005 | Corsi et al. | 341/161 |
| 7,852,248 | B1 * | 12/2010 | Keramat et al. | 341/143 |
| 7,919,992 | B2 * | 4/2011 | Rossi | 327/12 |
| 2005/0238123 | A1 * | 10/2005 | Ranganathan et al. | 375/343 |

* cited by examiner

*Primary Examiner* — Brian Young
(74) *Attorney, Agent, or Firm* — North Weber & Baugh LLP

(57) ABSTRACT

Various embodiments of the invention provide for cancellation of a residue amplifier output charging current at the reference voltage source of the reference buffer thereby preventing the charging current from altering the effective reference voltage of a reference buffer. In certain embodiments, current cancellation is accomplished by subtracting a current of the same magnitude.

20 Claims, 10 Drawing Sheets

US 8,830,099 B1

MDAC WITH DIFFERENTIAL CURRENT CANCELLATION

BACKGROUND

A. Technical Field

The present invention relates to analog-to-digital converters (ADCs), and more particularly, to systems, devices, and methods of increasing conversion accuracy by reducing undesired current flow into reference voltage sources applied to multiplying digital-to-analog converters (MDACs).

B. Background of the Invention

Switched-capacitor circuits are an established technique for the processing of analog signals, and they are often preferred for high-speed and high-resolution filters and ADC applications, such as pipeline and sigma-delta ADC. In pipeline ADC applications, the burden of quantizing a continuous analog input signal is distributed among multiple stages. Typically, each stage has a sub-ADC that quantizes the input signal, a DAC that subtracts an estimate of the input signal, and a residue amplifier that amplifies the difference to be further processed by a subsequent stage. The DAC and residue amplifier together are known as multiplying digital-to-analog converter, or MDAC. The DAC structure utilizes a reference voltage that ideally is insensitive to the input signal or ADC data. Settling the reference voltage to a precise voltage level is one of the primary challenges for high accuracy data converters. The settling of the reference voltage is made even more challenging due to the simultaneous residue amplification, which injects or draws current into the reference voltage as the output residue voltage approaches its final value. What is needed are tools for circuit designers to overcome the above-described limitations.

SUMMARY OF THE INVENTION

Various embodiments of the invention allow to cancel a charging current of a residue amplifier that otherwise would flow into the reference voltage source of a reference buffer as the residue amplifier generates a residue signal within an MDAC.

In particular, certain embodiments of the invention provide for cancellation of a residue amplifier output charging current at the reference voltage source of the reference buffer by subtracting a current of the same magnitude. Current cancellation prevents erroneous charging currents from altering the effective reference voltage of the reference buffer.

In certain embodiments of the invention, current cancellation decreases the settling time of the reference buffer and provides for increased speed and reduced power consumption of switched-capacitor circuits with operational amplifier based circuits.

In some embodiments utilizing zero-crossing detector based circuits, converter linearity is improved by preventing output residue charging currents from flowing into the reference voltage nodes of the MDAC and impacting the effective reference voltage or generating nonlinearity in the resulting ADC.

Certain features and advantages of the present invention have been generally described in this summary section; however, additional features, advantages, and embodiments are presented herein or will be apparent to one of ordinary skill in the art in view of the drawings, specification, and claims hereof. Accordingly, it should be understood that the scope of the invention shall not be limited by the particular embodiments disclosed in this summary section.

BRIEF DESCRIPTION OF THE DRAWINGS

Reference will be made to embodiments of the invention, examples of which may be illustrated in the accompanying figures. These figures are intended to be illustrative, not limiting. Although the invention is generally described in the context of these embodiments, it should be understood that it is not intended to limit the scope of the invention to these particular embodiments.

DETAILED DESCRIPTION OF THE PREFERRED EMBODIMENTS

In the following description, for the purpose of explanation, specific details are set forth in order to provide an understanding of the invention. It will be apparent, however, to one skilled in the art that the invention can be practiced without these details. One skilled in the art will recognize that embodiments of the present invention, described below, may be performed in a variety of ways and using a variety of means. Those skilled in the art will also recognize additional modifications, applications, and embodiments are within the scope thereof, as are additional fields in which the invention may provide utility. Accordingly, the embodiments described below are illustrative of specific embodiments of the invention and are meant to avoid obscuring the invention.

Reference in the specification to "one embodiment" or "an embodiment" means that a particular feature, structure, characteristic, or function described in connection with the embodiment is included in at least one embodiment of the invention. The appearance of the phrase "in one embodiment," "in an embodiment," or the like in various places in the specification are not necessarily all referring to the same embodiment.

Furthermore, connections between components or between method steps in the figures are not restricted to connections that are effected directly. Instead, connections illustrated in the figures between components or method steps may be modified or otherwise changed through the addition thereto of intermediary components or method steps, without departing from the teachings of the present invention.

In this document the term "reference voltage" denotes the effective reference voltage at the reference terminals of a non-ideal voltage source as seen by the rest of the circuit coupled to the voltage source. Thus, reference number 302 in FIGS. 3-9 denotes the effective reference voltage that takes into consideration the effect of the source impedance denoted by reference number 304. Where the description herein discusses only one side of a differential circuit, it is understood that the mirrored side functions accordingly.

Figure 1:
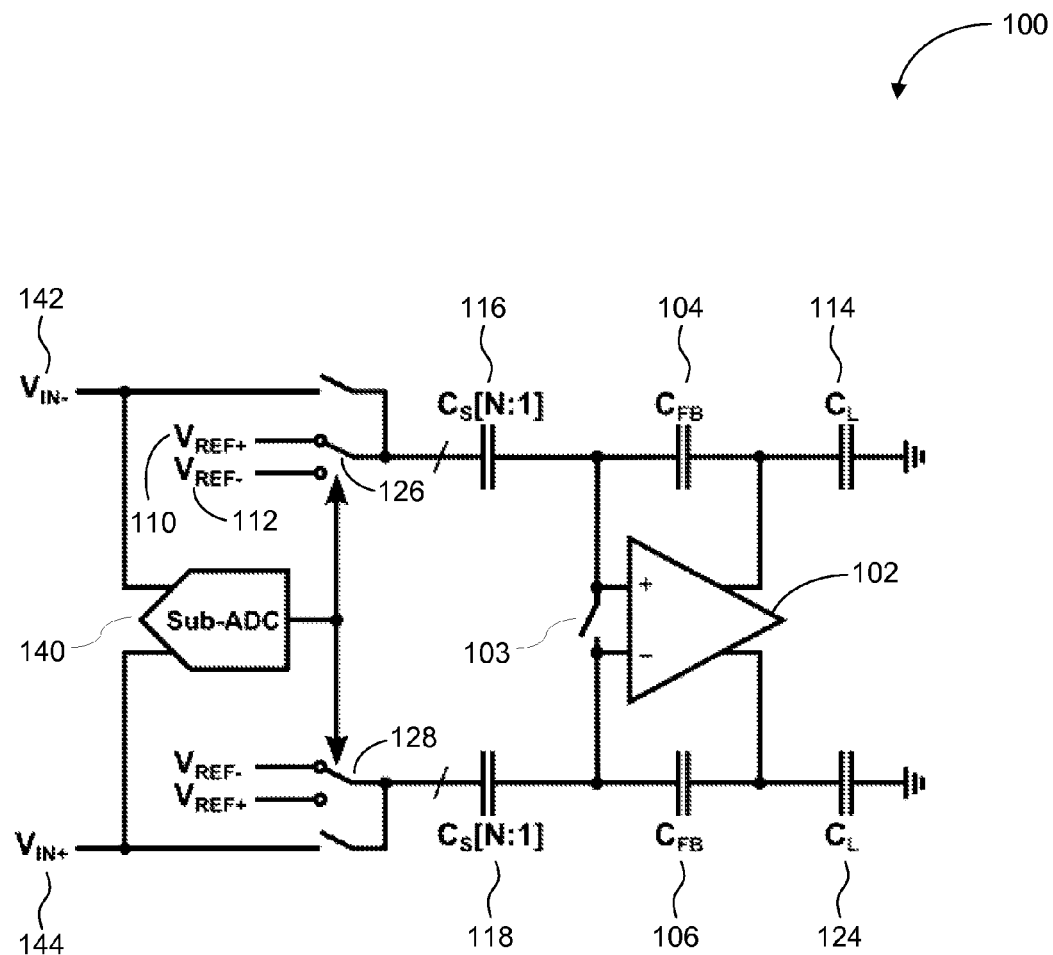
FIG. 1 is a schematic of an illustrative prior art implementation of an MDAC within a pipeline ADC stage utilizing an operational amplifier for residue voltage amplification.

Traditionally, residue amplification is achieved by using high-gain operational amplifiers placed in a closed-loop feedback system. FIG. 1 is a schematic of an illustrative prior art implementation of an MDAC within a pipeline ADC stage utilizing an operational amplifier for residue voltage amplification. The input voltage 142, 144 is sampled onto an array of sampling capacitors CS 116, 118 coupled between switches 126, 128, the operational amplifier 102, and the switch 103. Sub-ADC 140 may be comprised of N comparators each of which may output a digital signal, and each output may control one of switches 126, 128 to select either VREF+ or VREF−, which may be supplied by a reference buffer (not shown).

Operational amplifier 102 ideally forces the differential input voltage at its input to a virtual ground condition by continuously driving the output voltage. If operational amplifier 102 can be approximately described by the S-domain transfer function A/(1+S/ωp), then the output voltage of operational amplifier 102 will exponentially settle from its initial voltage to a steady-state value. The current through capacitor CFB 104, 106 flowing through MDAC switches 126, 128 and either into reference voltage VREF+ 110 or voltage reference VREF− 112, depending on the configuration of MDAC switches 126, 128, also settles exponentially. When the output residue voltage of amplifier 102 of ADC stage 100 is subsequently sampled by a following stage (not shown), ideally, very little current flows into reference voltage VREF+ 110 or VREF− 112, respectively.

Although there is little current flowing into the reference buffer in a steady state condition, the reference buffer provides significant current during the charging of the output voltage of amplifier 102. As is well known, if the reference buffer is applied to the MDAC capacitors as amplifier 102 converges, both amplifier 102 and the reference buffer should settle simultaneously. Ideally, the overall time constant of the small signal settling process is approximately the sum of the time constants of the reference buffer and amplifier 102. Consequently, for a given time period available for settling, and compared to the case with an ideal reference buffer, amplifier 102 should be designed with much higher speed in order to ensure that the differential signal path settles in the allotted time. The effective settling time of the reference buffer is then a critical metric that affects the achievable speed and power of switched-capacitor circuits utilizing operational amplifiers. It is therefore desirable to significantly reduce the current provided by reference voltage VREF+ 110, VREF− 112 to differentially charge the capacitor network to generate the output residue voltage of amplifier 102.

Figure 2:
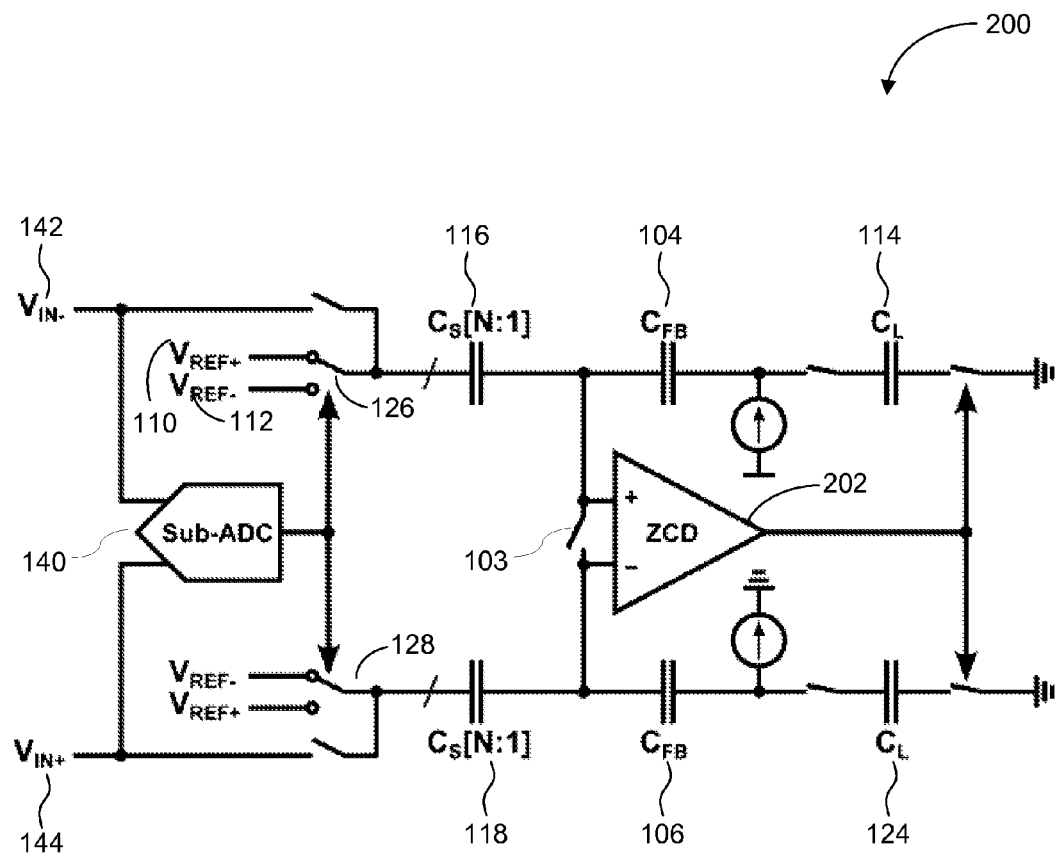
FIG. 2 is a schematic of an illustrative prior art implementation of an MDAC in a pipeline ADC stage utilizing a zero-crossing detector (ZCD) for residue voltage amplification.

FIG. 2 is a schematic of an illustrative prior art implementation of an MDAC in a pipeline ADC stage utilizing a zero-crossing detector (ZCD) for residue voltage amplification. For clarity and simplicity, components similar to those shown in FIG. 1 are labeled in the same manner. Current sources 206, 208 provide current flow through feedback capacitor 104, 106 and sampling capacitor 116, 118. The current can be a constant current or dynamically vary as a function of the input of ZDC 202.

Generally, in ADC architectures based on comparators and zero-crossing detectors, the residue voltage approaches the final value with a constant slope. The moving output voltage induces a constant current to flow into reference voltage VREF+ 110, VREF− 112, even at the instant when the output voltage of ZCD 202 is sampled by the following stage (not shown). Reference voltage VREF+ 110, VREF− 112 of ADC stage 200 should be stable while current sources 206, 208 charge feedback capacitors 104, 106 to the differential output residue voltage.

Figure 3:
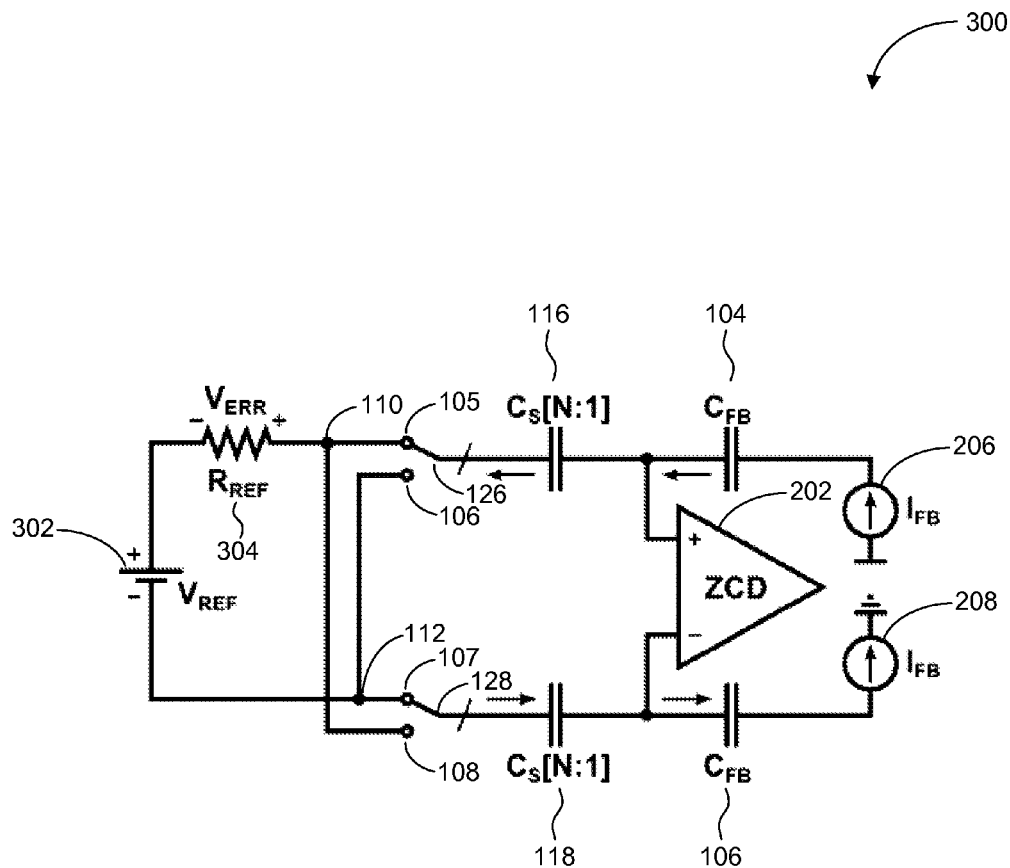
FIG. 3 is a schematic illustrating data-dependency of the reference voltage in a prior art ZCD circuit caused by a constant ramp current.

FIG. 3 is a schematic illustrating data-dependency of the reference voltage in a prior art ZCD circuit caused by a constant ramp current. For clarity and simplicity, sub-ADC 140, which coarsely quantizes the estimate of the analog input voltage signal shown in FIGS. 1 and 2 is omitted in FIG. 3 and subsequent figures. After the input voltage is sampled by any method known in the art, the input is disconnected from MDAC 300 during the output residue generation phase. As in FIG. 2, MDAC 300 utilizes a ZCD 202 to perform output residue voltage amplification. Current sources 206, 208 provide a constant current flow through feedback capacitor CFB 104, 106 throughout the charge transfer. An amount of current approximately equal to 1/N of the total current flows through each sampling capacitor CS 116, 118 into MDAC switches 126, 126. Therefore, unlike in the case of the operational amplifier shown in FIG. 2, the outputs approach each other linearly rather than exponentially. Whether the current flows into positive or negative reference voltage node 110, 112 is determined by the configuration of MDAC switch 126, 126. The switch configuration, in turn, is a function of the bit decisions of the sub-ADC (not shown) coupled to MDAC 300. In other words, where the charging current flows is data dependent.

Reference voltage source 302 has a non-zero reference source impedance, RREF, 304 that alters the effective reference voltage 302 as seen by MDAC 300. Depending on configuration of MDAC switch 126, 126 switched to the positive reference voltage node 110, as shown in FIG. 3, the voltage drop across RREF 304 causes a data-dependent error voltage, VERR, that adds to reference voltage VREF 302 and affects the precision of the data conversion. Neglecting parasitic and transistor device capacitances, for a sub-ADC decision DMDAC ranging from −N/2 to N/2, where N represents the total number of MDAC capacitors, the reference voltage error VERR is given by:

$$V_{ERR} = \frac{2 \cdot D_{MDAC}}{N} \cdot I_{FE} \cdot R_{REF}$$

The error in the charging current reference voltage introduces a second-order distortion term that distorts the linearity of the resulting ADC. If ZCD 202 in MDAC 300 utilizes a two-phase ramp, the ramp in the second phase may exhibit significantly less current than a single-slope ramp ZCD; however, the nonlinearity may still be significant for high accuracy ADC's. In addition, since the current in the first phase is generally relatively large compared to the current in the second phase, the reference voltage error is respectively larger. As a result, the accuracy of the first zero-crossing detection is degraded by the larger reference voltage error. It is therefore desirable to significantly reduce the data-dependent reference voltage error, VERR, caused by current flowing into non-zero reference source impedance, RREF, 304 during an entire ramp trajectory.

Figure 4:
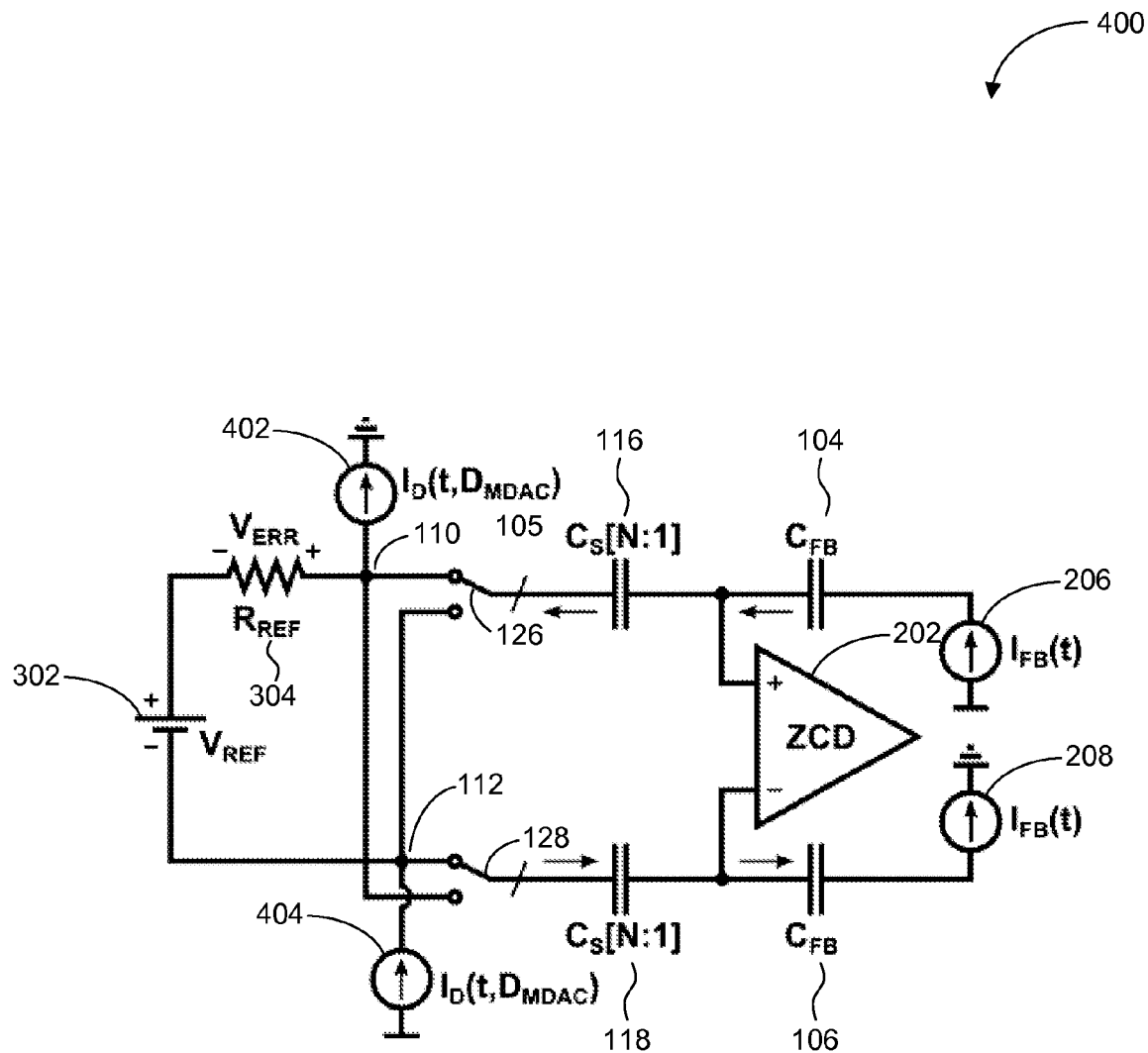
FIG. 4 is a schematic of an illustrative implementation of current cancellation, according to various embodiments of the invention.

FIG. 4 is a schematic of an illustrative implementation of current cancellation according to various embodiments of the invention. MDAC 400 may be implemented as an integrated circuit in a pipelined ADC system with multiple converter stages that pass residual signals to subsequent stages. MADC 400 comprises a residue amplifier, for example switched-capacitor ZCD 202, to achieve output residue voltage amplification. MDAC switches 126, 128 are controlled, for example, by control signals generated by a sub-ADC (not shown). The control signals determine to which reference voltage (e.g., one of two voltages VREF+ or VREF−) each sampling capacitor CS 116, 118 in the array is to be coupled. Current source 206, 208 generates ramp charging current, IFB, that flows through feedback capacitor CFB 104, 106 to ramp the output voltage of ZCD 202 to an appropriate residual signal.

In one embodiment, compensating current source 402 injects into reference voltage node 110 a compensating current ID of the same magnitude of the portion of the ramp charging current flowing into the reference voltage node 110 to cancel it. Similarly, compensating current ID is generated by compensating current source 404 to cancel the portion of the ramp charging current flowing into the reference voltage node 112, both in terms of data dependency and in terms of time dependency. For example, since for a given ramp charging current of current source 206, 208, VERR and DMDAC are linearly related, current source 402, 404 should also have the same relationship. If the waveform of the ramp charging current is not a constant slope but rather is time-varying (e.g., a two-phase ramp), then current ID should also minor the trajectory of the ramp charging current.

In one embodiment, current source 402, 404 is implemented as a current DAC that delivers current directly to the respective positive or negative reference voltage node 110, and 112, respectively. Note that a current DAC is simply a current source comprising series switches, and the series switches may be controlled with the same DMDAC decisions as MDAC switches 126, 126 that couple sampling capacitors CS 116, 118 to VREF+ 110 or VREF− 112.

Figure 5:
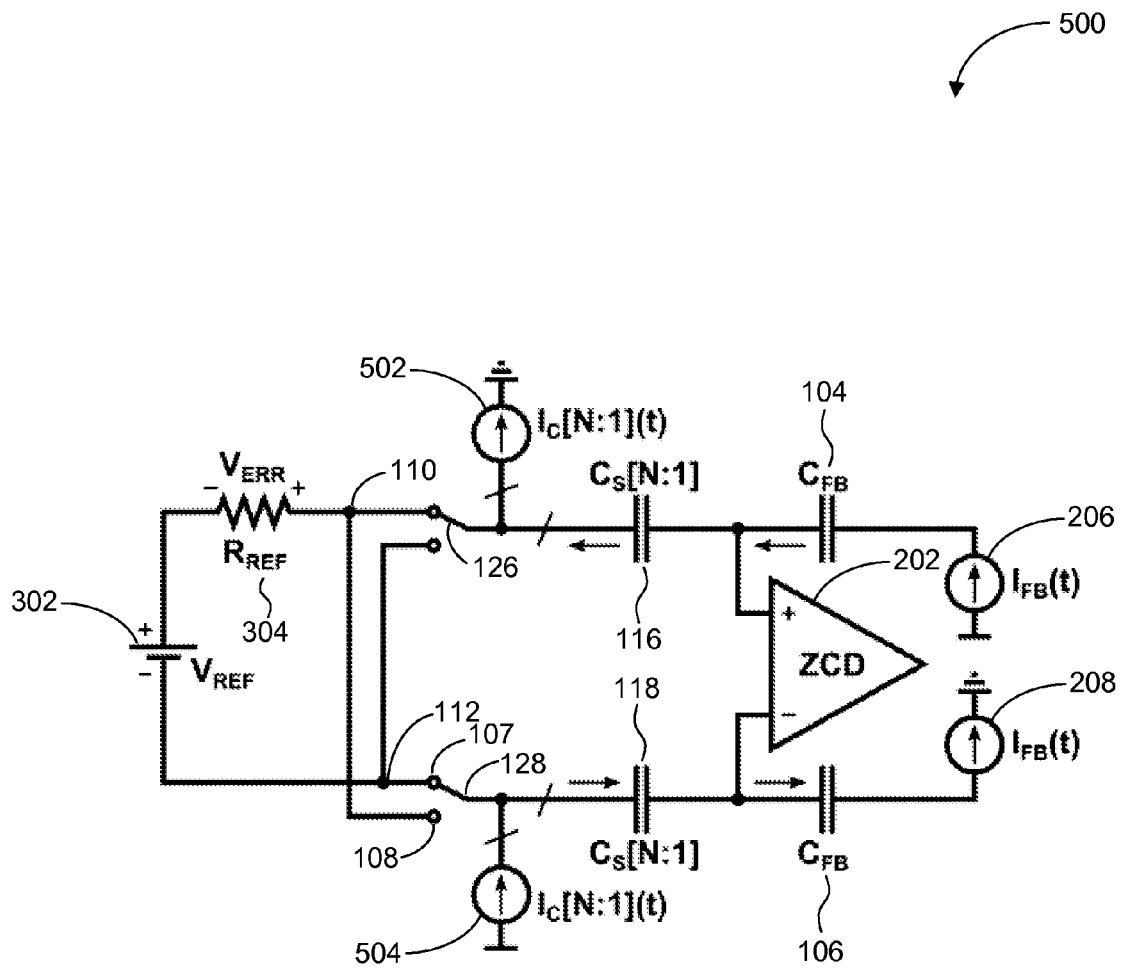
FIG. 5 is a schematic of another illustrative implementation of current cancellation, according to various embodiments of the invention.

FIG. 5 is a schematic of another illustrative implementation of current cancellation according to various embodiments of the invention. Circuit 500 comprises an array of time-varying compensating current sources 502 denoted as IC[N:1](t). Current sources 502 are coupled between MDAC switch 126 and an array of sampling capacitors CS 116. In one embodiment, each compensating current source 502 is coupled to a corresponding sampling capacitor CS within array 116. While implementing current source 502 adds some amount of complexity to circuit 500, especially for implementations with a large number of stage bit decisions, it removes the data-dependency of current source 502, which is very desirable.

The output voltage of current source 502 can be either VREF+ or VREF−. In one embodiment, a power supply voltage comprising a relatively large voltage compared to reference voltage 302 is utilized to ensure that the output range of compensating current source 502 supports both voltages VREF+ and VREF−. Implementing current source 502 with such an output range may be quite challenging given that current source 502 needs headroom for proper biasing and receives current through positive reference voltage node 110 while current source 504 sinks current into negative reference voltage node 112.

Figure 6:
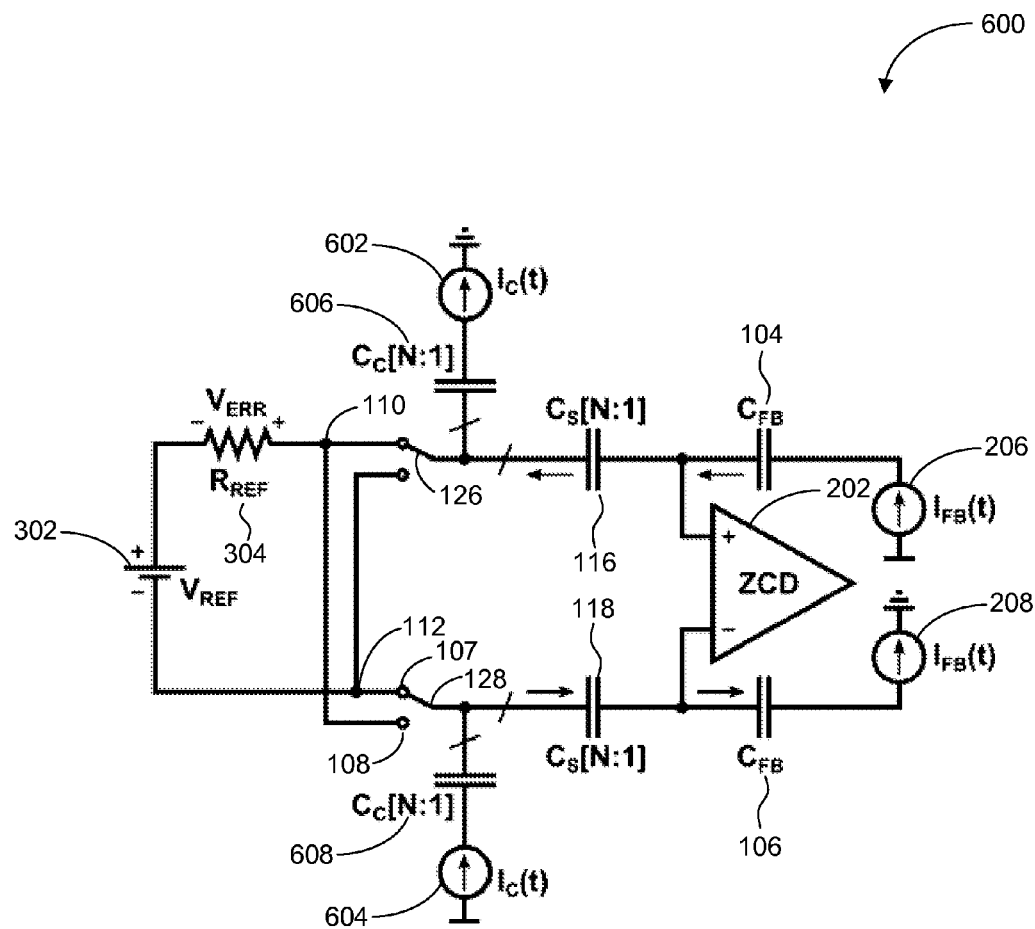
FIG. 6 is a schematic of an illustrative implementation that is functionally similar to current cancellation shown in FIG. 5, according to various embodiments of the invention.

FIG. 6 is a schematic of an illustrative implementation that is functionally similar to current cancellation shown in FIG. 5, according to various embodiments of the invention. Current cancellation circuit 600 addresses both the current source output range issue as well as the complexity of implementing and operating an array of current sources. Capacitor array 606, 608 is coupled in series between current source 602, 604 and MDAC switch 126, 128, respectively. In operation, compensating current IC 602, 604 is delivered to MDAC switch 126, 128 through capacitor array CC 606, 608. Capacitor array CC 606, 608 isolates the output voltage of current source 602, 604 from reference voltage node 108, 112. A reset operation of the output voltage of current source 602, 604 may be used to set initial conditions similar to the manner in which the IFB output voltages are reset.

For single-slope architectures, where the output ramp rate is not time varying, the primary challenge in the topology of circuit 600 is ensure that current source IC 602, 604 delivers the correct amount of compensating current into reference voltage node 108, 112. In practice, parasitic capacitance (not shown) due to wiring and the input capacitance of ZCD 202 will divert current originating from current source 206, 208, so that the amount of compensating current required from current source IC 602, 604 is relatively less than the feedback current IFB. The compensating current flowing into reference voltage node 108, 112 can be optimized, for example, through simulations, or a tuning mechanism such as an analog or digital control, in order to minimize potential errors. In one embodiment, any uncompensated reference voltage error, VERR, at reference source impedance, RREF, 304 can be calibrated in the same procedure as, for example, the digital calibration for removing capacitor mismatch.

For dual-slope architectures with time-varying output ramp trajectories, it is quite challenging to calibrate a time-varying current source in order to significantly remove the reference voltage error, VERR, throughout the entire output waveform. For example, a dual-slope trajectory would likely require a tuned current source for each of the phases. More complex waveforms would be increasingly difficult to compensate.

Figure 7:
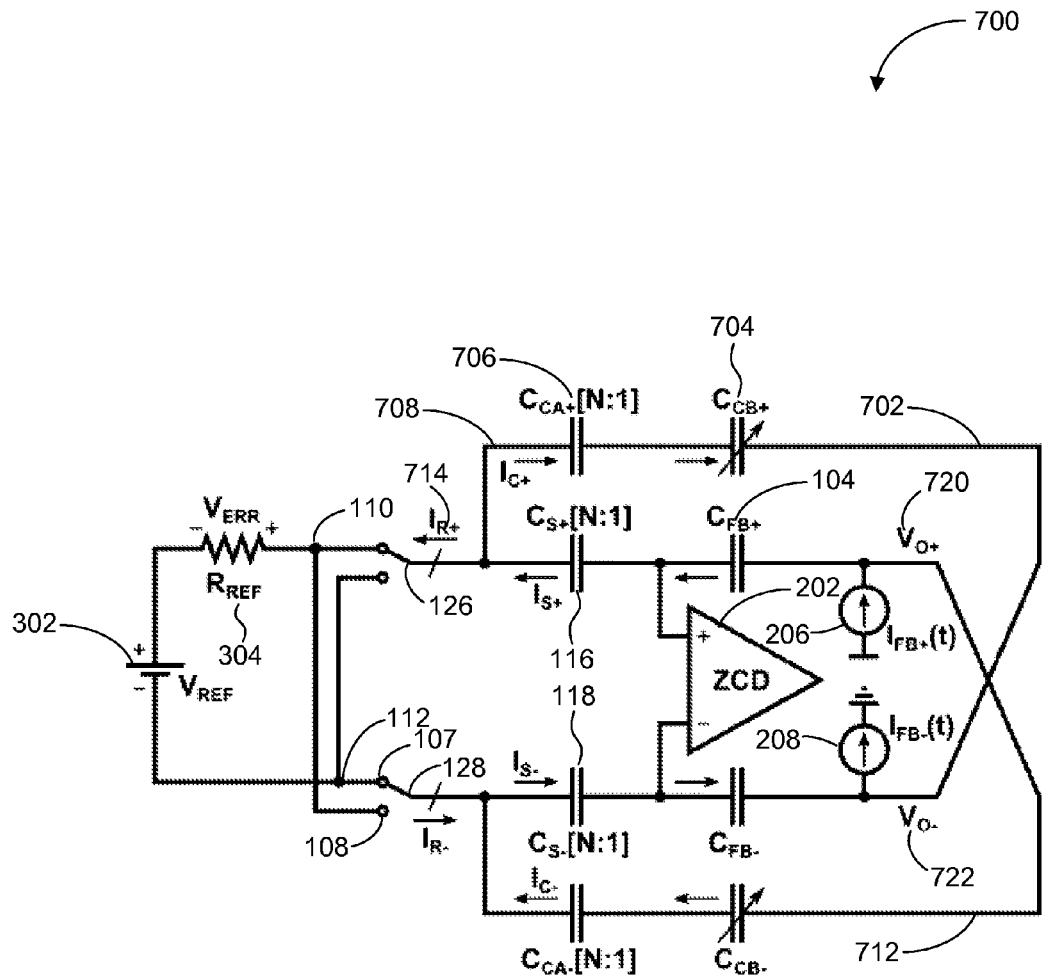
FIG. 7 is a schematic of another illustrative implementation of current cancellation, according to various embodiments of the invention.

FIG. 7 is a schematic of another illustrative implementation of current cancellation according to various embodiments of the invention. Circuit 700 comprises a differential capacitive feedback path 708 coupled between MDAC switch 126 and the output of charging current source 208. The feedback path comprises capacitor 704 and an array of capacitors 706 coupled in series with capacitor 704. One terminal of capacitor 704 is at output voltage V0− of charging current source 208.

Assuming that reference voltage 302 is constant, and ignoring parasitic capacitance, current IS+ 710 flowing from sampling capacitors CS+ 116 to MDAC switch 126 is equal to:

$$I_{S+} = \left(\frac{C_S C_{FB}}{C_S + C_{FB}}\right)\frac{dV_{O+}}{dt}$$

Similarly, compensating current IC+ 708 flowing through capacitors CCA+ 706 and CCB+ 704 is given by:

$$I_{C+} = -\left(\frac{C_{CA+}C_{CB+}}{C_{CA+} + C_{CB+}}\right)\frac{dV_{O-}}{dt}$$

Since IR+=IS+−IC+, and because we can assume differential operation, it follows that:

$$I_{R+} = \frac{dV_{O+}}{dt}\left[\left(\frac{C_S C_{FB}}{C_S + C_{FB}}\right) - \left(\frac{C_{CA+}C_{CB+}}{C_{CA+} + C_{CB+}}\right)\right]$$

Therefore, the amount of current flowing into reference voltage 302 can be eliminated if series capacitance of capacitors CCA+ 706 and CCB+ 704 can be matched to the series capacitance of CS+ 116 and CFB+ 104. In addition, the differential capacitive load presented to the reference buffer may effectively be cancelled, enabling the buffer to settle much faster and consume less power. Since parasitic capacitances and output residue amplifier input capacitance may alter this result, provisions can be made to adjust the capacitance of capacitors CCA+ 706 and CCB+ 704 through techniques commonly known to those skilled in the art of circuit design, for example, by employing an array of switched capacitors. These calibration techniques may be accomplished through transistor-level simulations with extracted layout parasitics, through measurements on a systematic level, or on a part-by-part basis with background or foreground techniques.

For the implementation in FIG. 7, an assumption has been made that the charging of CFB 104 to the output residue voltage is differential in nature. In practice, the differential matching of current sources 206 and 208 may limit the achievable amount of current cancellation. However, any amount of differential matching between current sources 206 and 208 provides a benefit in terms of cancelling current that otherwise would flow into reference voltage node 110 and 112, respectively. One skilled in the art will appreciate that additional techniques may be used to enhance the differential matching of current sources 206 and 208, including discrete-time feedback loops that adjust one or both of current sources 206 and 208.

Figure 8:
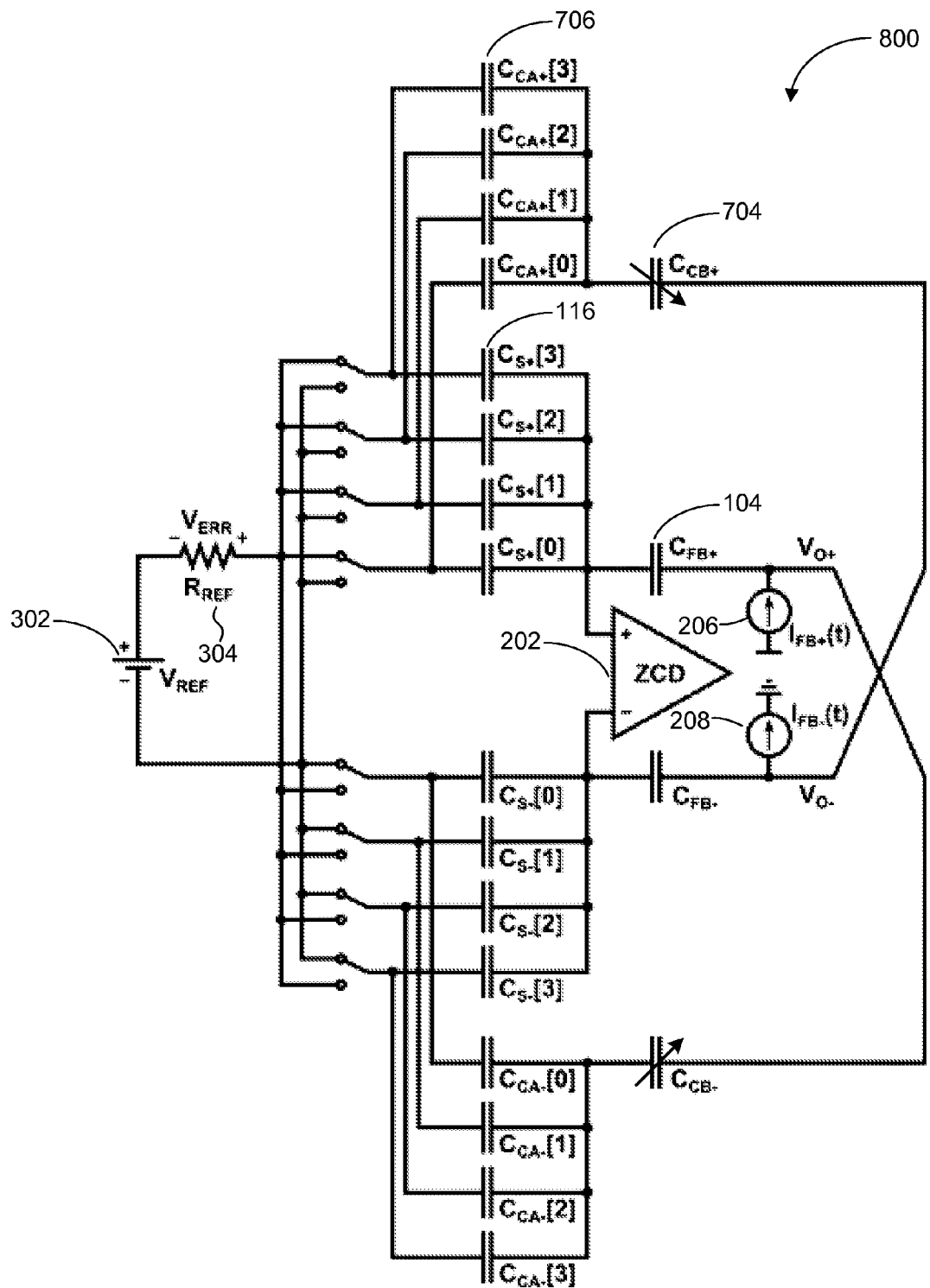
FIG. 8 is an exemplary implementation of current cancellation presented in FIG. 7 where N=4, according to various embodiments of the invention.

FIG. 8 is an exemplary implementation of current cancellation presented in FIG. 7 where N=4, according to various embodiments of the invention. Circuit 800 comprises four capacitors CCA+ 706 coupled to capacitor CCB+ 704 in a series configuration, and four capacitors CS+ 116 coupled in series with CFB+ 104. Other values of N may similarly be realized with any other number of capacitors in the arrays. Capacitor CCB+ 704 may be a variable capacitor. Further, additional capacitor networks may be added, for example between CCA+ 706 and CCB+ 704.

It is envisioned that the invention is not limited to MDAC topologies constructed with zero-crossing detectors. The invention may be applied to other architectures constructed with comparators, closed-loop operational amplifiers, open-loop amplifiers, or other MDAC topologies.

Figure 9:
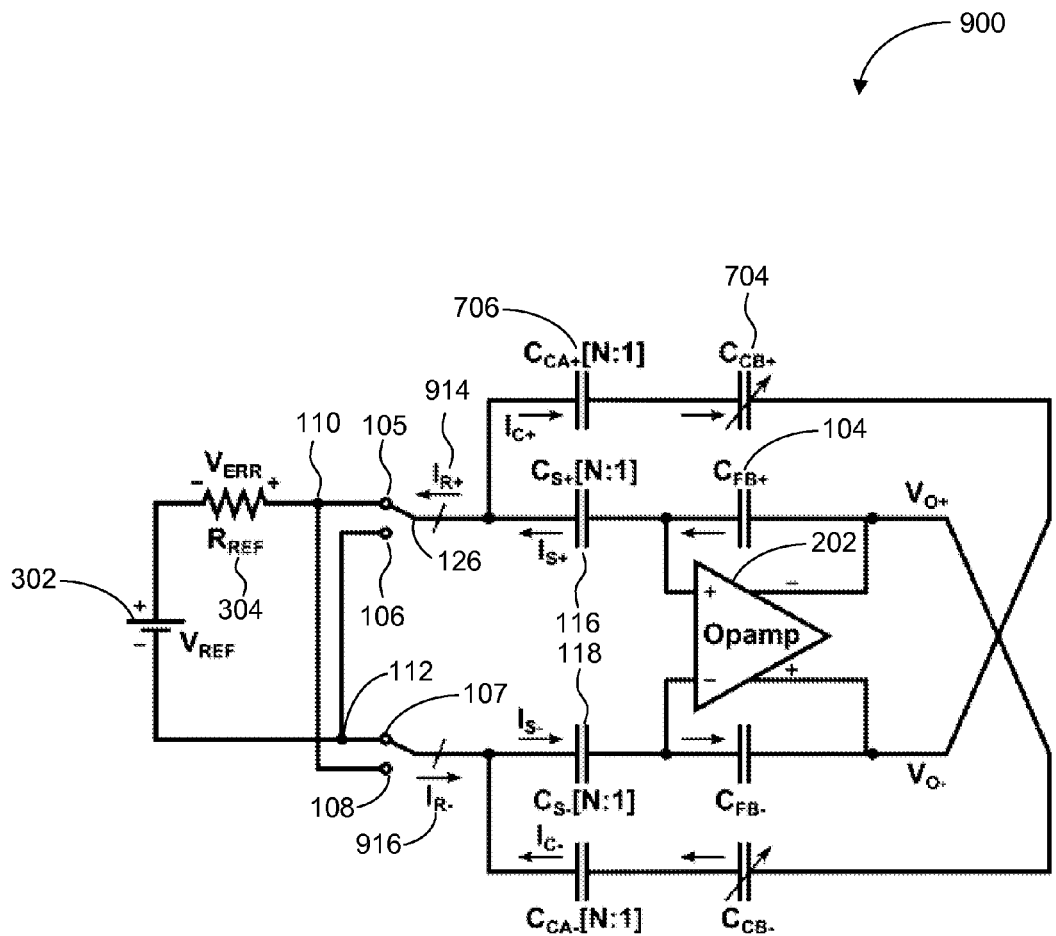
FIG. 9 is a schematic of an illustrative implementation of current cancellation utilizing capacitors and a closed-loop operational amplifier, according to various embodiments of the invention.

FIG. 9 is a schematic of an illustrative implementation of current cancellation utilizing capacitors and a closed-loop operational amplifier, according to various embodiments of the invention. In this embodiment the compensation of current 914 flowing into reference voltage 302 benefits the dynamic settling behavior of reference voltage 302. Specifically, having a replica capacitive structure connected to the opposite polarity of operational amplifier 202 ensures first order cancellation of the kick-back injected by the operational amplifier 202 slewing and/or charging the output residue voltage. By alleviating the need for the reference buffer to provide significant current and time in recovering from this kick-back, the power consumption of both the reference buffer and amplifier 202 can be reduced. In addition, the differential capacitive load presented to the reference buffer is effectively cancelled, enabling the buffer to settle much faster with lower power consumption. Note that although this implementation does not necessarily alleviate the common-mode kick-back, the differential response is more important for the vast majority of applications.

It is understood that the provided descriptions and schematics are exemplary in nature and not intended to constitute the entire set of possible implementations. For example, implementations of compensating DACs may have offsets, be differential in nature, etc., while maintaining the same function of current compensation. Similarly, various capacitor networks can be used as alternatives to the network shown FIG. 7 to achieve similar compensating effects.

Figure 10:
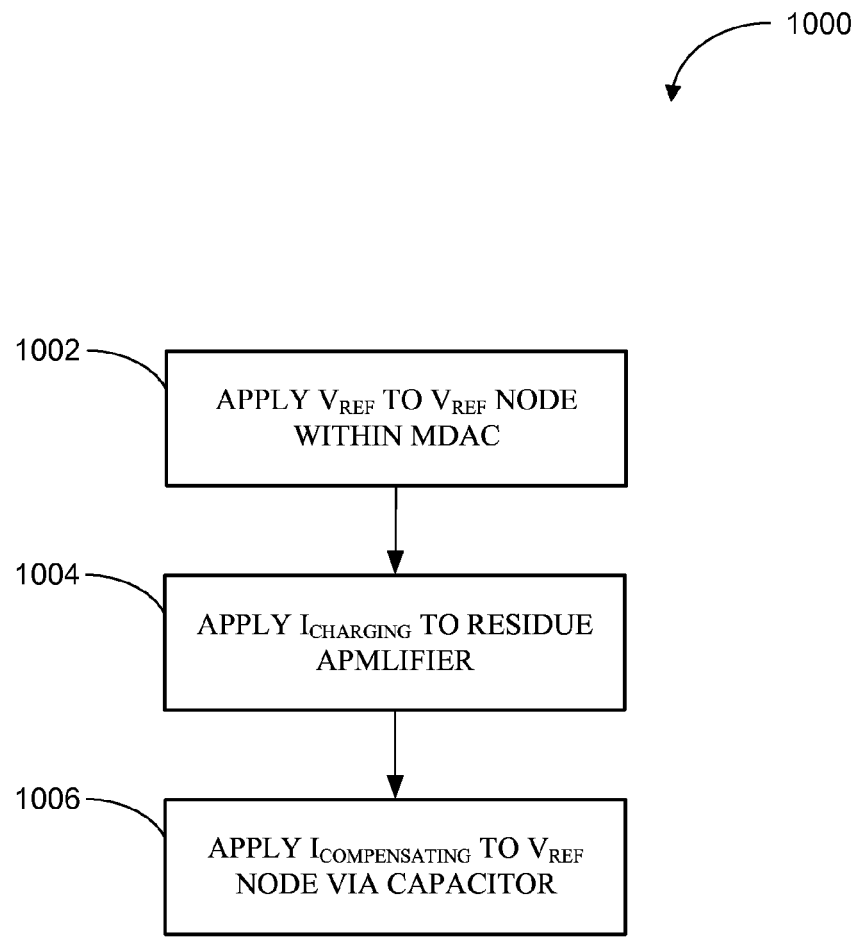
FIG. 10 is a flowchart of an illustrative process for cancelling current flowing into a reference source, according to various embodiments of the invention.

FIG. 10 is a flowchart of an illustrative process for cancelling current flowing into a reference source. The cancellation process starts at step 1002 when a reference voltage is applied to a reference voltage node of an MDAC. The reference voltage node is coupled to a reference source, such as a sub-ADC that may control the reference node.

At step 1004, a charging current is applied to a residue amplifier via a capacitor. The capacitor may be part of a capacitor network that comprises a feedback capacitor that provides current to the residue amplifier. The capacitor network also contains an array of sample capacitors.

Finally, at step 1006, a compensating current is applied to the reference voltage node. The compensating current may be applied, for example, via a decoupling capacitor.

It will be appreciated by those skilled in the art that fewer or additional steps may be incorporated with the steps illustrated herein without departing from the scope of the invention. No particular order is implied by the arrangement of blocks within the flowchart or the description herein. It will be further appreciated that the preceding examples and embodiments are exemplary and are for the purposes of clarity and understanding and not limiting to the scope of the present invention. It is intended that all permutations, enhancements, equivalents, combinations, and improvements thereto that are apparent to those skilled in the art, upon a reading of the specification and a study of the drawings, are included within the scope of the present invention. It is therefore intended that the claims include all such modifications, permutations, and equivalents as fall within the true spirit and scope of the present invention.

We claim:

1. A multiplying digital-to-analog converter (MDAC) to generate a residue signal, the MDAC comprising:
    a set of switches configured to switch between at least a first voltage node and a second voltage node;
    a residue amplifier comprising an output that is configured to be charged to an output voltage, charging of the output of the residue amplifier induces a first current flowing at least into either one of first or second voltage nodes;
    a set of sampling capacitors coupled to the set of switches, the set of sampling capacitors is configured to receive voltages at the first and second voltage node;
    a feedback capacitor coupled to an input of the residue amplifier, the feedback capacitor is coupled to be charged to the output voltage; and
    one or more compensating current sources coupled to the set of switches, the one or more compensating current sources provide a compensating current that at least partially cancels the first current.

2. The MDAC according to claim 1, wherein the residue amplifier comprises a charging current source coupled to the feedback capacitor.

3. The MDAC according to claim 2, wherein the charging current source is implemented within the residue amplifier.

4. The MDAC according to claim 2, wherein the feedback current source is configured to apply a charging current through the feedback capacitor to charge the residue amplifier to the output voltage.

5. The MDAC according to claim 1, wherein the one or more compensating current sources provide a compensating current of a polarity opposite to that of the first current.

6. The MDAC according to claim 1, wherein the compensating current is calibrated to reduce the first current.

7. The MDAC according to claim 1, wherein the one or more compensating current sources provide a compensating current that is proportional to the first current.

8. The MDAC according to claim 1, wherein the one or more current sources are variable.

9. The MDAC according to claim 1, wherein the one or more current sources comprise a plurality of capacitors.

10. The MDAC according to claim 9, wherein the plurality of capacitors is coupled to an inverse polarity of the output of the residue amplifier.

11. The MDAC according to claim 1, further comprising an array of decoupling capacitors coupled to the set of switches to isolate an output voltage of the one or more current sources form the set of switches.

12. The MDAC according to claim 1, wherein the one or more current sources comprise a current DAC.

13. The MDAC according to claim 1, wherein the residue amplifier comprises an operational amplifier, the operational amplifier comprises a differential input port and a differential output port.

14. The MDAC according to claim 1, wherein the residue amplifier comprises a zero crossing detector, the zero crossing detector comprises a differential input port.

15. An ADC system comprising an MDAC according to claim 1 and a sub-ADC, the sub-ADC receives and quantizes an analog input voltage.

16. The ADC system according to claim 15, wherein the sub-ADC comprises a plurality of comparators each of which outputs a signal to control the set of switches.

17. The ADC system according to claim 15, wherein the MDAC comprises capacitors that are switchable between an input or residue voltage, and reference voltages.

18. The ADC system according to claim 17, wherein the sub-ADC generates control signals that determine a switch configuration to select reference voltages to be applied to the MDAC capacitors.

19. A method to reduce current flowing into a reference source of an MDAC, the method comprising:
   applying through a set of switches a reference voltage to one or more nodes within the MDAC;
   delivering a charging current to a residue amplifier output, the charging current induces a first current flowing into the one or more nodes; and
   delivering a compensating current to the one or more nodes within the MDAC, the current at least partially cancels the first current.

20. The method according to claim 19, wherein the delivering a compensating current comprises applying a differential output voltage of the residue amplifier to a plurality of feedback capacitors.

\* \* \* \* \*